United States Patent [19]

Engler et al.

[11] Patent Number: 5,077,267

[45] Date of Patent: Dec. 31, 1991

[54] PROCESS FOR MAKING COMPOSITE HIGH TEMPERATURE SUPERCONDUCTOR COPPER WIRES

[75] Inventors: Edward M. Engler; Toivo T. Kodas; Victor Y. Lee, all of San Jose, Calif.

[73] Assignee: International Business Machines Corporation, Armonk, N.Y.

[21] Appl. No.: 217,925

[22] Filed: Jul. 12, 1988

[51] Int. Cl.$^5$ .............................................. B05D 7/14
[52] U.S. Cl. ...................................... 505/1; 505/704; 505/740; 505/737; 427/62; 427/237
[58] Field of Search ............................ 427/62, 63, 237; 29/599; 505/818, 819, 740, 704, 737, 1

[56] References Cited

U.S. PATENT DOCUMENTS 4,336,242 6/1982 Schmidberger et al. ............ 423/594
4,784,686 11/1988 Meek et al. ............................ 75/0.5

OTHER PUBLICATIONS

Yamada et al., "Critical Current Density of Wire Type Y-$B_a$-$C_u$ Oxide Superconductor" Jpn. J. Appl. Phys. 26(5) May 1987, L865-866.
Maeda et al., "A New High-Tc Oxide Superconductor Without a Rare Earth Element" Jpn. J. Appl. Phys. 27(2), Feb. 1988, L209-210.
Hazen et al., "100K Superconducting Phases in the Tl-$C_a$-$B_a$-$C_u$-O System", Physical Rev. Lett., vol. 60(16), Apr. 1988, pp. 1657-1660.
Matsuda et al., Super Conducting Tape-Shaped Wire By. . ., Material Research Society Symposium Proc., vol. 99, 1988, p. 695.
Tagano et al., Developments of Tape and Wire Fabrication. . . , Material Research Society Symposium Proc., vol. 99, 1988, p. 191.
Jin et al., Fabrication of Dense $BA_2YCu_3O_{7-8}$. . ., Applied Physics Letter, vol. 51(12), Sep. 21, 1987, p. 943.
Glowacki et al., External & Internal Diffusion of Oxygen. . ., Paper AA7.35 Materials Research Society Symposium Proc., Boston, 12/87.
McCallum et al., Problems in the Production of. . ., Advances in Ceramic Materials, May 1987.
Kohno et al., Characteristic of High-$T_c$ Oxide Wire, Yama Conf. on Superconductivity, Physics B, 148(1-3), p. 429.
Ohmatsu et al., Superconducting Wires of High $T_c$ Oxides, Japanese Journal of Applied Physics, 26, Supplement 26-3, L1207, 1987.
Kodas et al., Aerosol Flow Reactor Production of Fine. . ., Appl. Phys. Lett. 52(19), May 9, 1988.

*Primary Examiner*—Shrive P. Beck
*Assistant Examiner*—Roy V. King
*Attorney, Agent, or Firm*—Joseph G. Walsh

[57] ABSTRACT

A process for forming a composite high temperature superconductor copper wire, said process comprising the steps of (1) directing a submicron sized powder of a superconducting ceramic material through a length of copper tubing to coat the interior surface of said tubing with a uniform compact film of said powder, and (2) sintering said powder while passing oxygen through said tube and while maintaining the outside of said tube in an inert atmosphere. In a preferred embodiment an aerosol process is used to generate the submicron sized powder of the superconductor.

6 Claims, No Drawings

PROCESS FOR MAKING COMPOSITE HIGH TEMPERATURE SUPERCONDUCTOR COPPER WIRES

DESCRIPTION

The present invention is concerned with a process for making composite high temperature superconductor copper wires.

BACKGROUND OF THE ART

Matsuda et al., Material Research Society Symposium Proc., V. 99, 1988, p. 695, shows a process for making silver-based wires.

Togano et al., Material Research Society Symposium Proc., V. 99, 1988, p. 191, shows a copper tape coated with a superconductor formed from a mixture of oxides.

Jin et al., Applied Physics Letter, V. 51(12), 21 Sept. 1987, p. 943, shows a molten oxide process for forming superconductor wires.

Glowacki et al., Paper AA7.35 Materials Research Society Symposium Proceedings, Boston, 12/87, shows a composite superconductor based upon a outer cladding of silver.

McCallum et al., Advances in Ceramic Materials, May 1987, discuss problems in fabricating $YBa_2Cu_3O_x$ superconducting wires.

Kohno et al., Yamada Conference on Superconductivity, published in Physica B, 148(1–3), p. 429, describe characteristics of high Tc oxide wires.

Ohmatsu et al., Japanese Journal of Applied Physics, 26, Supplement 26-3, L1207, 1987, show a method for making high Tc oxide wires.

It is obvious that none of the above prior art employs the process steps required by the present invention.

DISCLOSURE OF THE INVENTION

The key to many practical applications of the new high temperature ceramic superconductors is the ability to fabricate them into useful forms in a way that is compatible with other materials. Efforts to fabricate wires have been plagued by the brittle nature of these materials and their poor normal state resistivity. This has necessitated the use of more pliable metal supports which also act as a current shunt in case the superconductor transforms to its normal state.

The present invention overcomes these difficulties and provides a method for fabricating composite high temperature superconductor wires which is compatible with using copper and which permits long lengths of wire to be fabricated. According to the present invention, a composite high temperature superconductor copper wire is formed by the steps of (1) directing a submicron sized powder of a superconducting ceramic material through a length of copper tubing to coat the interior surface of said tubing with a uniform compact film of said powder, and (2) sintering said powder while passing oxygen through said tube and while maintaining the outside of said tube in an inert atmosphere.

The process of the present invention is applicable to all ceramic superconductors. These materials have become very well known in the last few years. They include, for example, rare earth-based materials first discovered by the pioneering work of Bednorz and Muller, yttrium-based materials, thallium-based materials, and bismuth-based materials. All these ceramic superconductors comprise various metals and oxygen. They all share the common physical properties of ceramics, including brittleness and difficulty of fabrication. All such materials, however, are suitable for use in the present invention.

The superconductivity properties of these materials are very dependent on the details of the processing conditions. In particular, high temperature, oxygen-atmosphere sintering is essential to achieve optimum, bulk superconducting behavior which makes fabrication of composite structures with other more reactive materials very difficult.

In a preferred embodiment of the present invention, the micron sized powder is formed by an aerosol process. Such a process is described in Kodas et al., Applied Physics Letter 52 (19), 9 May 1988, p. 1622, which is incorporated herein by reference. As may be seen from this publication, submicron sized powder of a superconducting ceramic material is prepared by the steps of (1) forming submicron sized droplets of an aqueous solution containing the desired amounts of cations to form a high temperature superconductor, and (2) carrying said droplets in an oxygen flow through an oven at about 900°–1,100° C. to form a submicron sized powder which is superconducting.

As a typical illustration of the process of the present invention, a constant output atomizer is used to nebulize an aqueous solution of Y, Ba, and Cu nitrates. The nebulizer produces micron sized droplets that are carried in an oxygen flow through an oven at about 1,000° C. Exiting the oven is a submicron (less than 0.5 micron) powder of $Y_1Ba_2Cu_3O_7$ superconductor. X-ray and susceptibility measurements confirm the formation of the superconductor. These fine powders when directed through a length of copper tubing will coat, under the proper temperature gradients, the inner walls to provide an uniform, compact film. The next step is to fix the $Y_1Ba_2Cu_3O_7$ powder to the copper by sintering it into a bulk superconductor. This is done by having the copper tube in an inert atmosphere (for example, Argon) and passing heated oxygen (700°–900° C.) through the inside of copper tube. This results in heating from the inside out and minimizes the reaction of copper with oxygen during sintering. The outer copper surface is protected from oxidation by the inert atmosphere.

Key features of the present invention are the use of very small particles (less than 0.5 microns) of the superconductor which deposit by thermophoresis and Brownian diffusion to form a dense coating, the ability to move the deposition zone by controlling the temperature gradients, and the ability to heat only the inner tube surface in an oxygen atmosphere. In addition, these fine, high-purity powders produced in the aerosol flow reactor are more readily sintered under milder conditions. The process lends itself to large scale operations producing practical composite wires of long length.

In the preferred embodiment of the present invention, an aqueous solution of the metal cation salts in the appropriate stoichiometry of the desired ceramic superconductor is passed through an aerosol generator in an oxygen flow to form fine droplets of the solution with an average diameter of 0.5–1.0 microns. A number of commercial aerosol generators are suitable including Collison nebulizers and ultrasonic nebulizers. The use of aqueous solutions of the nitrate salts eliminates the possibility of carbon contamination in the reacted powder from either the solvent or precursors. The droplets are passed through a dryer to remove the water. The dried particles are then carried in the flow stream through a furnace where the precursor compounds react with the oxygen carrier gas to form the superconducting powder. Since the particles come into contact with only water and the materials composing the aerosol generator, contamination problems in the superconductor powder are minimized. Particles with average diameters much less than a micron or as large as several microns can be produced by varying the initial aerosol droplet size and solution concentration. Narrow particle size distributions can be obtained by using aerosol generating systems incorporating a cyclone or impactor to remove particles above a chosen size.

Powder generation is carried out at temperatures from 900°-1,100° C. with reactor residence times of 10-100 seconds. Reactor residence time is controlled by the oven length and carrier gas flow rate. Typical oven lengths are 50-150 cm, and carrier gas flows of several liters per minute to several tens of liters per minute. Thermogravimetric analysis (TGA) indicated>99% complete reaction can be obtained by optimizing these reactor conditions. X-ray diffraction analysis of the reacted powders showed that single phase superconducting structures were prepared. Magnetic susceptibility measurements using a S.H.E VTS 920 SQUID magnetometer showed that the as-reacted powders were superconducting without further processing.

To produce a superconductor copper composite wire, the particles in the oxygen carrier gas exiting the reactor are sent into a copper tube where deposition takes place to coat the inside surface of the tube. By using very small particles (less than a micron in diameter) the superconducting material deposits on surfaces by thermoporesis action and by Brownian diffusion to form a dense and uniform coating. For long lengths of copper tubing, uniformity of the coating can be controlled by placing the tubing in a temperature gradient. Because the coating mechanism involves diffusion, any surface or shape is readily coated. After the desired amount of superconducting powder is deposited the coated copper tube is heated in the presence of an oxygen flow to the sintering temperature of the superconducting ceramic. Typically this corresponds to heating at temperatures ranging from 800°-1,000° C. for times ranging from several minutes to several hours, depending on the specific superconductor being used and the amount and thickness of material being sintered. Since copper is reactive in oxygen at elevated temperatures, a typical procedure is to heat the external area of the copper tube in an inert atmosphere such as nitrogen or argon, while passing an oxygen flow through the copper tube. Alternately, preheated oxygen at the appropriate sintering temperature can be passed directly into the coated copper tube. Sintering produces an adherent superconducting film on the inside of the copper tube. Since average particle diameters are on the order of 1 micron or less, tubes as small as 1 mm or less and as large as desired can be coated internally. The length of tube that can be coated is limited only in the sense that a longer tube requires a longer time to be coated to the required thickness. Uniformity in thickness along the copper tube length is provided by a temperature gradient. That is, at the inlet to the copper tube a higher temperature is maintained to reduce the deposition rate. Both straight and coiled tubes can be coated as well as flat surfaces that can be used to produce superconducting tapes.

Submicron particle deposition takes place by Brownian diffusion and thermophoresis, the relative contributions of these mechanisms being dictated by the operating conditions. Particle deposition by Brownian diffusion can be carried out at high temperatures thus allowing the simultaneous deposition and sintering of the particles. Particle deposition by thermophoresis depends on the radial temperature gradient in the gas flowing through the tube. This feature can be used to coat very long copper tubes. The location of this gradient along the tube length and the magnitude of the gradient can be controlled by varying the tube wall temperature. Thus, the location of the deposition zone can be moved along the length of a long copper tube to provide a uniform deposit. When deposition is carried out at temperatures much below the sintering temperature for the material, sintering can be achieved by passing oxygen at approximately 800°-1,000° C. through the tube while exposing the outside of the tube to an inert gas. This allows sintering and subsequent annealing of the superconductor in the presence of oxygen thereby overcoming the need for oxygen diffusion through the copper tube walls in order to achieve the correct oxygen content in the superconductor. Since the material can be easily heated in the presence of oxygen once deposited, the particles that are used to form the deposit do not have to be superconducting. This allows the formation of superconductor copper wires using systems in which the aerosol particles themselves are not superconducting as long as diffusion and reaction in the deposited film result in the formation of a superconducting material.

The following examples are given solely for purposes of illustration, and are not to be considered limitations of the present invention, many variations of which will occur to those skilled in the art, without departing from the scope or spirit thereof.

EXAMPLE 1 $Y_1Ba_2Cu_3O_x$-wires

A 0.03 M aqueous solution of yttrium nitrate, barium nitrate and copper nitrate with a molar ratio of 1:2:3 was passed through an aerosol generator producing 1-2 micron droplets. The aerosol was carried by an oxygen air stream at 3-10 liters per minute into a diffusion dryer to remove water vapor, and then enters a furnace (of approximate dimensions 10 cm diameter-100 cm length) at 900°-1,000° C. At the exit of the furnace, the reaction chamber was directly coupled down to smaller diameter copper tubing. The diameter of the tubing was varied from one mm to 6.5 mm in typical experiments. Since the superconducting particles produced are submicron in size, their movement follow Brownian diffusion towards the inside wall of the tubing, depositing out as a smooth coating.

The coated superconductor was sintered by heating the copper tube in an inert atmosphere (i.e., argon or nitrogen) at 880° C. while passing flowing oxygen through the tube for 60-120 minutes. This provided a continuous and electrically superconducting film on the inside of the copper tube. Four-point probe measurements, resistance vs. temperature, of this inside coating exhibit superconducting transitions with zero resistance at 90 K.

EXAMPLE 2

La(1−x)SrxCuOy-copper wires (where x equals 0.1-0.25):

Prepared as above except starting with an aqueous solution of La, Sr and Cu nitrates in the appropriate stoichiometry, passed through an aerosol generator.

After sintering as above, an electrically superconducting coating was obtained with a zero resistance transition at 35° K.

EXAMPLE 3

Bi2Sr2CaCu2Ox-copper wires

Prepared as above except starting with aqueous solution of Bi, Sr, Ca and Cu nitrates in the appropriate stoichiometry, passed through an aerosol generator. The furnace temperature was between 850°–900° C., and the sintering temperature was 800° C. for 5 minutes. An electrically superconducting coating on copper was produced with a zero resistance transition at 80° K.

EXAMPLE 4

Tl2-xBa2CaCu2Oy-copper wires (where x is variable from zero 0.5)

Prepared as above except starting with aqueous solution of Tl, Ba, Ca and Cu in the stoichiometry of Tl 2, Ba 2, Ca 1, Cu 2. The furnace temperature was at 850°–900° C., and the sintering temperature was 850° C. for 30 minutes. A superconducting coating was produced with a transition at 110° K.

We claim:

1. A process for forming a composite high temperature superconductor copper wire, said process comprising the steps of (1) directing a submicron sized powder of a superconducting ceramic material through a length of copper tubing to coat the interior surface of said tubing with a uniform compact film of said powder, and (2) sintering said powder while passing oxygen through said tube and while maintaining the outside of said tube in an inert atmosphere.

2. A process for forming a composite high temperature superconductor copper wire, said process comprising the steps of (1) forming submicron sized droplets of an aqueous solution of nitrates containing the desired amounts of cations to form a high temperature ceramic superconductor; (2) carrying said droplets in an oxygen flow through an oven at about 900°–1,100° C. to form a submicron sized powder which is superconducting; (3) directing said powder through a length of copper tubing to coat the interior wall of said tubing with a uniform compact film of said powder; and (4) sintering said powder while passing oxygen at 700°–1,000° C. through said tube and while maintaining the outside of said tube in an inert atmosphere.

3. A process as claimed in claim 1 wherein the ceramic material contains yttrium.

4. A process as claimed in claim 1 wherein the ceramic material contains thallium.

5. A process as claimed in claim 1 wherein the ceramic material contains bismuth.

6. A process as claimed in claim 1 wherein the ceramic material contains a rare earth element.

* * * * *